United States Patent
Li

(10) Patent No.: US 8,397,198 B1
(45) Date of Patent: *Mar. 12, 2013

(54) FIELD CONFIGURED ELECTRONIC CIRCUITS AND METHODS OF MAKING THE SAME

(75) Inventor: Jiang Li, San Jose, CA (US)

(73) Assignee: Kovio, Inc., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/323,279

(22) Filed: Dec. 12, 2011

Related U.S. Application Data

(63) Continuation of application No. 12/405,909, filed on Mar. 17, 2009, now Pat. No. 8,099,707.

(60) Provisional application No. 61/037,251, filed on Mar. 17, 2008.

(51) Int. Cl.
*G06F 17/50* (2006.01)

(52) U.S. Cl. ........ 716/118; 716/100; 716/119; 716/121; 716/128

(58) Field of Classification Search .............. 716/100, 716/118, 119, 139, 110, 121, 128
See application file for complete search history.

(56) References Cited

U.S. PATENT DOCUMENTS

| | | | |
|---|---|---|---|
| 7,152,804 B1 | 12/2006 | MacKenzie et al. | |
| 7,294,449 B1 | 11/2007 | Gudeman et al. | |
| 7,413,513 B2 | 8/2008 | Nguyen et al. | |
| 7,701,011 B2 | 4/2010 | Kamath et al. | |
| 7,767,520 B2 | 8/2010 | Kamath et al. | |
| 7,879,696 B2 | 2/2011 | Kunze et al. | |
| 8,099,707 B1 * | 1/2012 | Li | 716/139 |
| 2006/0211187 A1 | 9/2006 | Choi et al. | |
| 2007/0287237 A1 | 12/2007 | Rockenberger et al. | |
| 2009/0004370 A1 | 1/2009 | Zurcher et al. | |
| 2009/0020829 A1 | 1/2009 | Chandra et al. | |

* cited by examiner

*Primary Examiner* — Sun Lin
(74) *Attorney, Agent, or Firm* — The Law Offices of Andrew D. Fortney; Andrew D. Fortney

(57) ABSTRACT

Semiconductor devices and/or structures, and methods for fabricating the same are disclosed. Embodiments of the present invention allow for production of customized products, while also minimizing production steps, avoiding some or all photolithography steps, and reducing overall production costs. Using selective deposition and patterning methods such as printing, to form metal and/or dielectric layer(s) on substrates where one or more device circuit components are pre-made in a factory, but which require further processing to obtain an electrically functional circuit, results in the ability for a user/consumer to make custom, specific and/or unique electrically functional circuits without incurring the cost and complexity of a full fabrication to form and pattern all of the layers.

20 Claims, 10 Drawing Sheets

FIELD CONFIGURED ELECTRONIC CIRCUITS AND METHODS OF MAKING THE SAME

RELATED APPLICATIONS

This application is a continuation of U.S. Pat. No. 8,099,707 U.S. patent application Ser. No. 12/405,909, filed Mar. 17, 2009, which claims the benefit of U.S. Provisional Application No. 61/037,251, filed Mar. 17, 2008, each of which is incorporated herein by reference in its entirety.

FIELD OF THE INVENTION

The present invention generally relates to the held of integrated circuits and methods of manufacturing the same. More specifically, embodiments of the present invention pertain to field configurable circuits, exemplary methods for the same, and devices including the same.

BACKGROUND

The present invention addresses the relatively high production costs of integrated circuits and/or structures thereof that may be associated with manufacturing customized products. For example, one traditional integrated circuit concept utilizes "field programmable gate array" (FPGA) technology, where all of the circuit layers are fabricated in a factory, and thereafter, the circuit logic is electrically programmed in the field. While such technology may offer the convenience and flexibility of at-site programming, the cost is relatively high because specialized device, circuit, and programming architectures are required. This can limit the distribution and application of FPGA technology to specialized (and typically low-volume) applications. Thus, a need is felt for a way to manufacture custom circuits with fast turnaround time, and in small or large volumes, using relatively inexpensive and easy to use equipment.

SUMMARY OF THE INVENTION

The methods for forming an electronic circuit (e.g., a field configurable circuit) and the devices described herein address the above-described problems by using various field-configurable deposition and patterning methods to form semiconductor, metal and/or dielectric layer(s) on substrates where one or more device circuit components (e.g., transistors, inductors, capacitors, diodes, etc., and/or combinations thereof, in regular and/or irregular arrays) may be pre-made in a factory, but require further processing to yield an electrically functional circuit and/or product. Such pre-rnade device circuit components may be distributed to customers and/or partners who complete the electrically functional circuit and/or product by relatively simple metal and/or dielectric printing steps. Using such pre-made device circuit components allows customers and/or partners to make custom, specific, and possibly unique electrically functional circuits and products, without incurring the cost and complexity of the full fabrication process, including forming and patterning all other layers.

In contrast to traditional semiconductor processing, printing dielectric and/or metal layers is relatively simple and inexpensive, and can be relatively easily performed in the field without requiring highly specialized equipment or skills. Furthermore, printing such layers on pre-made device circuit components does not require special device architectures to allow a customer and/or partner to (re)configure a circuit into another unique electrically functional circuit and/or product. The methods and devices described herein have far-reaching applications, which include, but are not limited to, prototype building, security (e.g., customized encrypted information), and REID products (e.g., electronically encoding a product name, usage information, content, and/or other information by printing a ROM containing the information).

Aspects of the present invention relate to semiconductor devices and/or structures, and methods for fabricating the same. Embodiments of the present invention allow for production of customized products while also minimizing production steps, avoiding some or all photolithography steps, and reducing production costs.

A first aspect of the present invention concerns methods and software for field-programming integrated circuits. In one exemplary method, a user enters or inputs a design and/or logic, and/or circuit functions into a computer or other processing device. The computer is generally configured to design and correct one or more circuit layouts based on the design and/or logic functions entered by the user. The computer lays out (e.g., routs) one or more metal patterns (i.e., layouts) in accordance with predetermined placement and routing rules, and then makes corrections to the layout as needed. One or more patterned field-configured metal layers are subsequently printed onto the substrate including a pre-made transistor array and/or other pre-formed circuit components. A dielectric layer with a plurality of contact openings may be formed after each field-configured metal pattern, and a passivation layer (without contact openings, but with pad openings) may be formed on the uppermost field-configured metal pattern. Optionally, the substrate may further include a pre-formed dielectric over the transistor array and other pre-formed components, and optionally a pre-formed pattern of metal lines can be formed thereon.

Some embodiments may include software (e.g., computer-readable media comprising computer-readable instructions), circuits, systems, etc. adapted to perform the various operations disclosed herein. The software may be adapted for use in a general purpose computer, and may include a user interface configured to allow a user to select input, predetermined functions, and/or logic gates, and set predetermined signal timing parameters, and/or select specific correction and/or optimization operations to perform. In one alternative, embodiments of the present invention may be embedded (e.g., as application-specific integrated circuits, microprocessor firmware, software, etc.) in a printing device and/or component of a printing device (e.g., to process layouts according to the present invention). Additionally, embodiments of the present invention may include one or more programmable devices configured to perform various operations, and/or computer-readable media including instructions adapted to configure such a programmable device to perform these operations.

In a second aspect, the present invention concerns a method for fabricating a field configurable circuit, generally comprising depositing a first metal ink on or over a substrate according to a predetermined wiring pattern (e.g., a computer generated layout as described herein), and forming a pattern of metal lines or wires from the metal ink. The predetermined, field-configured wiring pattern enables predetermined functionality and/or logic in a circuit that includes the transistors and the wiring pattern. In exemplary embodiments, the substrate has at least a pre-formed array of transistors and a pre-formed first dielectric layer on the array. The pre-formed first dielectric layer may have a first plurality of contact openings therein that expose a surface of each terminal of the transistors, to facilitate electrical connection with subsequently formed patterned metal lines.

The first metal ink may be deposited on the pre-formed substrate by coating or printing processes. In some embodiments, coating may comprise spin coating, inkjetting, gravure printing, flexographic printing, dip-coating, spray-coating, slit coating, extrusion coating, meniscus coating, microspotting and/or pen-coating the formulation onto the substrate. Printing generally refers to a process for selective deposition of a liquid-based composition (e.g., a solution, suspension, emulsion, etc.) in a predetermined pattern and with a characteristic resolution (e.g., minimum layout dimension, spacing, alignment margin of error, combination thereof, etc.), and may include processes such as inkjet printing, gravure printing, screen printing, offset printing, flexographic printing, syringe coating, microspotting, and pen-coating, although many such printing processes can also be used to form a continuous film. In a preferred embodiment, the field-configured pattern of metal lines is deposited by inkjet printing.

The first metal ink may comprise or consist essentially of a metal precursor material and a solvent. For example, the metal ink may comprise a metal-containing material in an amount of from 1 to 50 wt. % (or any range of values therein) of the ink and a solvent in which the metal-containing material is soluble. The metal precursors that are generally compatible with printing may comprise organometallic compounds or nanoparticles (e.g., nanocrystals) of a metal such as aluminum, titanium, vanadium, copper, silver, chromium, molybdenum, tungsten, cobalt, nickel, silver, gold, palladium, platinum, zinc, iron, etc. Suitable ink formulations are discussed in detail below with regard to exemplary methods for fabricating a field configurable circuit.

After the metal ink is printed or otherwise deposited on the pre-formed substrate, the metal ink may be dried to remove the solvent, and subsequently cured (e.g., by annealing) to form a field-configured pattern of metal lines or wires, as discussed in detail herein. However, it is not always necessary to print the first plurality of patterned metal lines in the field. On the contrary, in one embodiment, the lowermost pattern of metal lines may be part of the pre-formed substrate. The pre-formed pattern of metal lines may be electrically connected to the array of transistors on the substrate (e.g., in a local interconnect pattern).

A (second) dielectric layer may be formed in the field on the field-configured pattern of metal lines or wires. The field-configured dielectric layer generally has a plurality of contact openings therein. The field-configured dielectric layer may be selectively deposited (e.g., by inkjet printing, gravure printing, off-set lithography, screen printing, surface energy patterning, etc.) such that the dielectric layer is selectively patterned to form the holes therein. In other embodiments, the second dielectric layer may be blanket deposited or coated on the entire device using any suitable method known in the art, and then selected portions of the dielectric material removed (e.g., by photolithography and etching) to form the contact openings. Suitable materials for forming the dielectric layer(s) and methods of forming the same are discussed in detail below.

Many variations of the present method are possible. In some embodiments, additional dielectric layers (e.g., a third dielectric layer, a fourth dielectric layer, etc.) may be deposited on successive field-configured metal layers on the device. Thus, such dielectric layers may be formed in an alternating sequence or pattern with additional layers of field-configured metal lines and/or metal wires (e.g., a second and/or third pattern of metal lines, etc.). For example, a second field-configured pattern of metal lines may be formed (e.g., by printing in the field, etc.) on the first field-configured dielectric layer using the methods described herein. In some variations, a (third) field-configured dielectric layer may be formed on the second field-configured pattern of metal lines, also using any of the methods described herein. As with the previously formed dielectric layers, the third dielectric layer has a plurality of contact openings therein. In further embodiments, a third field-configurable pattern of metal lines may be fbrrned (e.g., by printing) on the third dielectric layer. In some implementations, a passivation layer may be formed on the uppermost field-configured metal pattern. The passivation layer may have pad openings formed therein.

In exemplary embodiments, at least one field-configured layer of patterned metal lines is formed on the pre-formed substrate. However, the invention is not limited as such. Additional and alternating layers of patterned metal lines and dielectric layers may be field-configured according to the computer-generated circuit layout for the desired device function(s). Each layer of patterned metal lines in the circuit is electrically connected to another layer of patterned metal lines through contacts formed in the contact openings in the underlying dielectric layer(s). Furthermore, in some implementations, a passivation layer may be formed on the top of the device.

A third aspect of the present invention concerns a device comprising (1) a substrate with a pre-formed array of transistors thereon, (2) a pre-formed first dielectric layer on the substrate having a first plurality of contact openings therein, each contact opening exposing a transistor terminal, (3) an optional first layer of pre-formed patterned metal wires electrically connected to the terminals of the transistors in the array, (4) an optional second pre-formed dielectric layer on the first metal layer having a second plurality of contact openings therein, the contact openings exposing a surface of the first layer of patterned metal wires, and (5) a first field-configured (e.g., printed) pattern of metal lines thereon or thereover.

The array of transistors may comprise a plurality of rows and a plurality of columns. In such embodiments, the intersection of a row and a column generally defines a location of one transistor in the array. Alternatively, the array of transistors may have an irregular shape.

In some variations, the device may include a first field-configured dielectric layer formed on the first field-configured pattern of metal lines. The first field-configured dielectric layer generally has a plurality of contact openings formed therein. The contact openings may be formed by selectively printing the dielectric layer to include the holes, or in the alternative, the contact openings may be formed conventionally (e.g., by etching) after the dielectric layer has been blanket deposited or coated over the entire substrate. A second field-configured pattern of metal lines may be formed on the first field-configured dielectric layer, and electrically connected to one or more of the other metal wires and/or metal lines in the structure through contacts in the contact openings of the dielectric layer(s). Additional layers of field-con figured dielectric and field-configured metal lines may be similarly formed on the device to form a circuit that performs one or more predetermined functions. In addition, the device may also include one or more capacitors, diodes, and/or inductors on the substrate, electrically connected to the transistors by the metal lines and/or metal wires.

The present invention provides semiconductor devices and methods for forming semiconductor devices that enable production of customized products while minimizing production steps and reducing production costs. The use of deposition and patterning methods to form metal and/or dielectric layers on a substrate where one or more device circuit components are pre-made in a factory, but which require further processing to yield an electrically functional circuit and/or product, allows a customer or partner to manufacture custom, specific and/or unique electrically functional circuits and/or products without the expense and complexity of a full fabrication process.

These and other advantages of the present invention will become readily apparent from the detailed description of preferred embodiments below.

DETAILED DESCRIPTION

Figure 1:
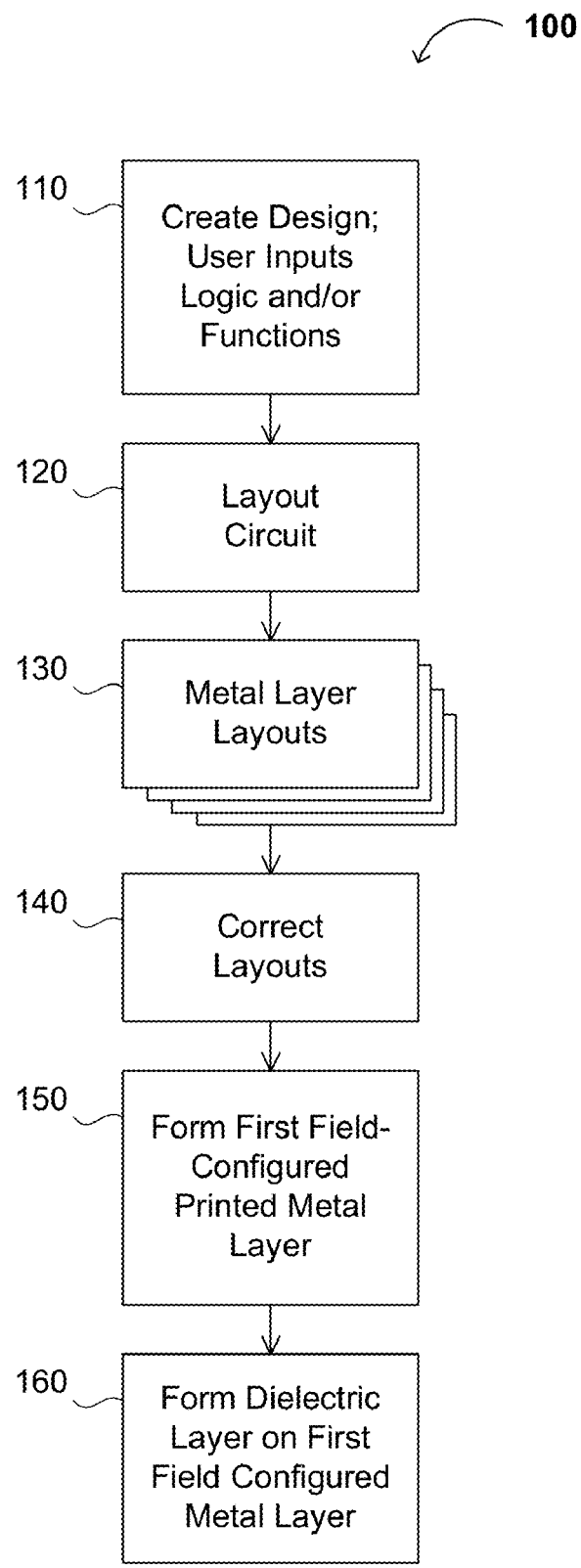
FIG. 1 shows a flowchart of an exemplary method of field programming an integrated circuit according to the present invention.

Reference will now be made in detail to various embodiments of the invention. While the invention will be described in conjunction with the following embodiments, it will be understood that the description is not intended to limit the invention to these embodiments. On the contrary, the invention is intended to cover alternatives, modifications, and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

In the present invention, the term "deposit" (and grammatical variations thereof) is intended to encompass all forms of deposition, including blanket deposition (e.g., CVD and PVD), coating, and printing. In various embodiments, coating or printing may comprise inkjet printing, gravure printing, screen printing, offset printing, flexo-printing, spray-coating, spin coating, slit coating, extrusion coating, dip coating, meniscus coating, microspotting and/or pen-coating the formulation onto the substrate. Also, for convenience and simplicity, the terms "part," "portion," and "region" may be used interchangeably, but these terms are also generally given their art-recognized meanings. Also, unless indicated otherwise from the context of its use herein, the terms "known," "fixed," "given," "certain," and "predetermined" generally refer to a value, quantity, parameter, constraint, condition, state, process, procedure, method, practice, or combination thereof that is, in theory, variable, but is typically set in advance and not varied thereafter when in use.

For the sake of convenience and simplicity, the terms "coupled to," "connected to," and "in communication with" mean direct or indirect coupling, connection or communication unless the context indicates otherwise. These terms are generally used interchangeably herein, but are generally given their art-recognized meanings. Furthermore, the terms "shape," "feature," "line," "wire," and "pattern" may be used interchangeably, although the meaning of any of these terms may be taken from the context of its use herein. The term "(semi)conductor," "(semi)conductive," and grammatical equivalents thereof refer to materials, precursors, layers, features, or other species or structures that are conductive and/or semi conductive, in general, the terms "pre-made" and "pre-formed" may be used interchangeably, and may refer to a structure formed in a factory or other manufacturing facility by conventional or any suitable method known in the art. In addition, the terms "contact hole" and "contact opening" may be used interchangeably herein, but are generally given their art-recognized meanings.

The capabilities of logic and/or circuitry described herein are not limited to the examples provided herein, and may include any relevant function that is capable of being configured in hardware. It is well within the ability of one skilled in the art to design and implement such logic.

Portions of the detailed descriptions herein have been presented in terms of processes, procedures, logic, function(s), and/or other representations of operations within a computer, signal processor, controller, sensor, and/or memory. These descriptions and representations are generally used by those skilled in the data processing arts to convey the substance of their work to others skilled in the art. A process, procedure, logic block, function, operation, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer and/or a signal or data processing system.

It should be borne in mind, however, that all of these and similar terms are associated with the appropriate physical quantities and are merely convenient labels applied to these quantities. Unless specifically stated otherwise and/or as may be apparent from the following discussions, it is appreciated that throughout the present application, discussions utilizing terms such as "processing," "determining," "displaying" or the like, refer to the action and processes of a computer or data processing system, or similar processing device (e.g., an electrical, optical, or quantum computing or processing device), that manipulates and transforms data represented as physical (e.g., electronic) quantities. The terms refer to actions, operations and/or processes of the processing devices that manipulate or transform physical quantities within the component(s) of a system or architecture (e.g., registers, memories, sensors, other such information storage, transmission or display devices, etc.) into other data similarly represented as physical quantities within other components of the same or a different system or architecture.

Although the description herein focuses on methods and hardware (e.g., architectures, systems, circuits and/or structures), the present invention also includes a computer program and/or software, implementable and/or executable in a general purpose computer or workstation equipped with conventional digital and/or analog signal processor(s), configured to perform one or more steps of the method and/or one or more operations of the hardware. Thus, a further aspect of the invention relates to software that implements the above method(s) and/or algorithm(s). For example, the invention may further relate to a computer program and/or computer-readable medium containing a set of instructions which, when executed by an appropriate signal processing device, is configured to perform the methods described herein. For example, the computer-readable medium may comprise any medium that can be read by a signal processing device configured to read the medium and execute code stored thereon or therein, such as a floppy disk, CD-ROM, digital versatile disk (MD), magnetic tape, or hard disk drive. Such code may comprise object code, source code, and/or binary code.

The invention, in its various aspects, will be explained in greater detail below with regard to exemplary embodiments.

Exemplary Methods and Software for
Programming/Designing a Field Configurable
Circuit A first aspect of the present invention relates to methods and software for designing and printing field-configurable metal and dielectric layers on substrates comprising circuit components (e.g., transistors, diodes, capacitors, inductors, combinations thereof, etc. in regular and/or irregular arrays), and optionally, metal and/or dielectric layers that have been pre-formed or pre-made (e.g., in a factory or other fabrication facility) using the methods described herein. Embodiments may include software (e.g., computer-readable media comprising computer-readable instructions), circuits, systems, etc., which are adapted to perform the operations disclosed herein. The software may be adapted to be executed by a general purpose computer, and may therefore also include object code to be displayed on a user interface configured to allow a user to select circuit functions and/or logic, select correction operations (including selecting and/or entering various correction or other parameters), and/or to apply manual selection of desired functions, logic, and/or wire routing. Similarly, embodiments of the present invention may include one or more programmable devices configured to perthrm the operations described herein, and/or computer-readable media including instructions adapted to configure such a programmable device to perform these operations. In addition, embodiments of the present invention may be embedded (e.g., as application-specific integrated circuits, microprocessor firmware, etc.) in a printing device and/or component of a printing device (e.g., to preprocess input layouts according to the present invention).

FIG. 1 shows an exemplary method 100 of field-configuring or field-programming integrated circuits according to embodiments of the present invention. In general, a user creates a design by inputting logic elements and/or circuit functions into a computer (step 110). In various embodiments, the logic may comprise buffers, latches, flip-flops, inverters, delays, and/or logic gates such as AND, OR, NAND, NOR, XOR, XNOR, etc. In other embodiments, the circuit functions may include analog-to-digital converters, digital-to-analog converters, counters, adders and subtractors, multipliers and dividers, integrators, modulators, demodulators, registers, shift registers, clock generators (e.g., phase-locked loops, delay-locked loops, voltage-or-current controlled oscillators, RC circuits, etc.), random access memories, read only memories, memory programming and/or erasing (e.g., read and/or write) circuits, AC→DC converters/rectifiers, encoders, decoders, interface circuits, multiplexes, clamps, voltage level shifters, amplifies, peak detectors, comparators, current mirrors, phase or phase-frequency detectors, etc. Such logic and/or circuit functionality can be described in any conventional hardware description language.

The computer then lays out the circuit (step 1120) using a circuit layout editor, such as a graphic data system (GDS) compatible layout editor, and/or a computer aided design application, such as AutoCAD or other similar program. In other implementations, the circuit may be laid out using an integrated circuit layout process, or "by hand" using an image drawing software application. The various metal layer layouts (step 130) may comprise one or more bitmapped image files, such as TIFF or BMP bitmap image files (e.g., where each pixel in the bitmapped image corresponds to a predetermined location for metal deposition and/or printing) and/or any other data format suitable for storing the output printable circuit layout (e.g., a GDS circuit description database, a TDB circuit description database, Caltech Intermediate Form [CIF] file, a Gerber file, drawing interchange format [DXF], or other circuit layout data file). In preferred embodiments, the image files are uncompressed or losslessly compressed (e.g., in a compressed tagged image file format [TIFF] bitmapped image file), because conventional lossy image compression algorithms (e.g., PEG) may discard information that would be imperceptible to human vision but nonetheless important for circuit manufacturing.

As shown in step 1140, the computer receives metal layer layouts 1130, which may be files or other data structures produced at step 120, and then corrects the layouts as necessary and/or desired. The correction process may include one or more processes such as reading the circuit layouts; converting, resampling, and/or otherwise pre-processing the input layout file to produce a suitable working bitmap before applying additional corrections; identifying die/substrate type and location thereon; identifying and processing shape data; determining and applying correction rules (e.g., shape correction rules, rules for re-routing metal lines and/or wires if one or more constraints in the design is/are violated, etc.); and/or manual manipulation of the layout.

In embodiments where correction rules are applied to the circuit layout(s), the correction rules may be implemented as process steps (e.g., executable instructions, methods, calculations, etc.), data (e.g., parameters, constants, user settings, etc.), or any combination thereof that describes or defines conditions and/or transformations for adapting an initial circuit layout to produce one or more metal layer layouts suitable for printing desired circuit features onto the substrate.

Furthermore, the correction rules may correspond to one or more ink characteristics (e.g., spreading characteristics, surface tensions properties, etc.) for a particular ink composition and/or processing characteristics for a particular printing/deposition apparatus and/or substrate material (e.g., output pixel density with sizes and/or ranges of sizes of identified shapes or structures, line drop density, area drop density, number of pixels to remove at the edges for a given shape, number of extra drops required, etc.).

As shown in step 150, a printer prints the field-configured metal layer as indicated in the corrected layouts from step 140. The corrected layout may include corrected bitmapped image files, "native" printer page description files, and/or any other suitable representation of the desired circuit layout. The corrected layout may be provided directly to a printing device to facilitate inkjet printing, micro-spotting, pen-coating, syringe dispensing, pump dispensing, vapor-jet printing, or other suitable printing method, in other variations, the corrected layout may be further processed and/or used to make a mask, screen, die, stamp, or other component used in the printing process (e.g., for gravure printing, offset lithography, flexographic printing, stamping, screen printing, etc.). As shown in step 160, a field-configured dielectric layer may then be formed on the first field-configured metal layer (i.e., the metal layer printed in step 150). Steps 150 and 160 may be repeated as necessary and/or desired, and step 160 may further include forming contact openings in the dielectric layer. The present method of field-programming integrated circuits allows for relatively precise control of spreading and effective coverage of features printed on a substrate using a printed ink composition which may include dielectric and/or conductive materials.

The present method may be used to customize an integrated circuit to include predetermined circuit functions and/or logic gates (e.g., a NAND gate, a NOR gate, etc.) as explained by the discussion of FIGS. 5A-5D and FIGS. 6A-6I) below.

Exemplary Methods for Fabricating a Field Configurable Circuit

A second aspect of the present invention relates to a method for fabricating a field configurable circuit. The method generally comprises depositing a first metal ink according to a predetermined wiring pattern, on or over a substrate having a pre-formed array of transistors and a pre-formed (first) dielectric layer thereon, and forming a first plurality of metal lines or wires thereon. A second dielectric layer may be either formed (e.g., by blanket deposition) or field-configured (e.g., printed such that a pattern of contact holes or openings remain on the dielectric layer) on the field-configured plurality of patterned metal lines or wires, and a second plurality of field-configured patterned metal lines may be formed on the second dielectric layer. Additional dielectric layers (e.g., third, fourth, etc.) and additional layers of patterned metal lines may be formed (e.g., configured in the field) in an alternating sequence on the device. The metal layers may be directly or indirectly electrically coupled to one another, and directly or indirectly coupled to the transistors in the array via contact openings formed in the dielectric layers. The predetermined wiring pattern(s) (e.g., designed using computers and/or software as previously described herein) enables predetermined functionality and/or logic in a circuit comprising the transistors and the wiring pattern(s).

Exemplary Methods of Forming a Field-Configurable Metal Layer

In general, a first plurality of field-configured pattern of metal lines is formed on a substrate having an array of transistors and a pre-formed dielectric layer (e.g., having contact openings) thereon.

Specifically, a first metal ink is deposited (e.g., by printing or other selective deposition techniques) in a pattern on an uppermost dielectric layer of the pre-formed substrate and in the contact openings in the dielectric layer. The metal ink is then dried and cured (e.g., by annealing) to form the pattern of metal wires or lines. Optionally, the substrate may also have a pre-formed plurality of metal lines on the pre-formed dielectric layer and/or in the contact openings as discussed below with regard to the pre-formed transistor array, first dielectric layer, and optionally the first pattern of metal lines.

To illustrate, one exemplary embodiment is shown in FIGS. 2A-2D. Specifically, in FIG. 2A, a substrate 100 includes a transistor array (e.g., comprising a gate dielectric 110, a gate electrode 112, and a plurality of source/drain terminals [not shown] in substrate 100) and a pre-formed dielectric layer 120. Contact openings in the pre-formed dielectric layer 120 contain a plurality of contacts 122, 124, 126, and 128. In this embodiment, a pre-formed pattern of metal lines or wires 132 on dielectric layer 120 is electrically connected to the terminals of the transistors in the array by contacts 122, 124, 126, and 128. Contact 122 connects a metal line or wire 132 to a source or drain terminal (not shown). Contact 124 connects another metal line to a transistor gate terminal 112. Contacts 126 and 128 connect to transistor terminals behind or in front of the plane of the page, to provide additional space for routing of metal lines 132. A second pre-formed dielectric layer 130 having a plurality of via holes is on the pre-formed pattern of metal lines or wires 132. Vias 134 in the holes in the pre-formed dielectric layer 130 may electrically connect wires in an overlying metallization pattern to wires 132 in the pre-formed metal pattern.

A first field-configured pattern of metal lines 140/142 is deposited (e.g., by printing) on the second (uppermost) dielectric layer 130 (and optionally in the via holes, when vias 134 are absent) in contact with the vias 134 or the underlying metal lines 132. The sections of field-configured metal lines 140 and 142 have a long, horizontal axis in the plane of the page. In this case, metal wire 140 connects a source/drain terminal of transistor 170 to the gate 112 of transistor 172, and transistor 174 is configured as a capacitor.

The metal lines 140/142 may be formed from a metal ink. The metal ink may be deposited on the uppermost dielectric layer (e.g., layer 130 of FIG. 2A) by printing (e.g., inkjetting, gravure printing, off-set lithography, screen printing, stencil printing, flexographic printing, microspotting, pen-coating, laser writing, syringe dispensing, and/or pump dispensing the metal ink), or in the alternative, by other suitable methods known in the art. In preferred embodiments, the first metal ink is printed by an inkjet printing process. Techniques for printing a liquid metal and/or metal precursor ink are described in U.S. Pat. Nos. 7,152,804 and 7,413,513, and in co-pending U.S. patent application Ser. Nos. 10/616,147, 11/203,563, 12/131,002, and 12/175,450, filed on Jul. 8, 2003, Aug. 11, 2005, May 30, 2008, and Jul. 17, 2008, respectively, the relevant portions of which are incorporated herein by reference.

in alternate embodiments, printing the first metal ink may comprise laser writing metal nanoparticles. Suitable metal nanoparticles for use in such embodiments are described in detail below. The laser writing process may comprise blanket-depositing nanoparticle-containing ink (e.g., by spin coating), drying the ink sufficiently to remove the solvent, and irradiating the metal nanoparticles sufficiently to cure, link, or fuse the metal nanoparticles. Additionally, the metal ink may comprise a photodefinable metal-containing species. In these embodiments, laser writing may comprise irradiating the photodefinable metal-containing species sufficiently to change the solubility characteristics thereof in a subsequently-used developer (see U.S. Pat. No. 7,294,449, the relevant portions of which are incorporated herein by reference).

In general, the first metal ink may comprise a metal precursor material (e.g., a metal compound, metal nanoparticles, and/or one or more organometallic compounds). In exemplary embodiments, the metal precursor material comprises a metal capable of withstanding high-temperature processing. The metal ink generally further comprises a solvent in which the metal precursor material is soluble. In such embodiments, the method may further comprise drying and/or curing (e.g., by annealing) the metal ink to remove the solvent and form the patterned metal lines. Drying the metal ink may comprise heating the substrate containing the printed metal precursor ink thereon. For example, the substrate may be heated to temperatures ranging of from 80 to 150 and for a length of time ranging from 1 second to about 10 minutes. In various implementations, the metal ink may be heated by placing the substrate on a hot plate, or in a convention furnace or oven. In many embodiments, heating may occur in an inert atmosphere. After the drying process, the substrate may be annealed to cure the dried metal ink. Annealing may comprise heating the substrate and the metal-containing material thereon at a temperature of from 100° C. to about 300° C. for about 1 minute to about 2 hours.

In exemplary embodiments, the metal ink may comprise the metal precursor material in an amount of 1 to 50 wt. % of the ink, and the metal precursor material is generally soluble in the solvent. The metal precursor material may comprise a metal compound, metal nanoparticles, one or more organometallic compounds, or combinations thereof. Suitable metal compounds for use in the metal precursor material may comprise metal compounds of aluminum, titanium, vanadium, copper, silver, chromium, molybdenum, tungsten, cobalt, nickel, gold, palladium, platinum, zinc, and/or iron, or alloys or mixtures of the same.

Suitable metal nanoparticles for use in the metal ink may comprise titanium, copper, silver, chromium, molybdenum, tungsten, cobalt, nickel, gold, palladium, platinum, zinc, and/or iron, as well as metal alloys thereof. In various embodiments comprising such metal nanoparticles, the nanoparticles may be passivated with one or more surfactants. In one variation, the metal nanoparticles have one or more ligands bound thereto. For example, the ligand(s) may comprise an alkyl, aralkyl, alcohol, alkoxy, mercaptan, alkylthio, carboxylic acid, and/or carboxylate group. Other exemplary metal ink formulations suitable for use in the present method, and methods of making such metal inks are described in detail in copending U.S. application Ser. Nos. 10/616,147, 11/888,942, and 11/888,949, respectively filed Jul. 8, 2003, Aug. 3, 2007, and Aug. 3, 2007, the relevant portions of each of which are incorporated herein by reference.

In another variation, the field-configurable patterned metal lines may be formed by printing a metal seed layer, and then plating a bulk conductive layer on the seed layer. The metal seed layer may comprise cobalt, nickel, silver, gold, copper, platinum, and/or palladium. The seed layer may be printed by a printing process as discussed herein. The bulk conductive layer may be formed by electroplating and/or electroless plating the bulk conductor onto the seed layer. In various implementations, the seed layer may comprise Pd, and the bulk conductive layer may comprise cobalt, nickel, copper, silver, gold, palladium, and/or platinum. In other exemplary embodiments, the patterned metal lines may be formed by laser writing the metal seed layer, and then plating the bulk conductor onto the laser written metal layer. See copending patent application Ser. Nos. 12/131,002 and 12/175,450, respectively filed on May 30, 2008 and Jul. 17, 2008, the relevant portions of each of which are incorporated herein by reference.

Figure 2A:
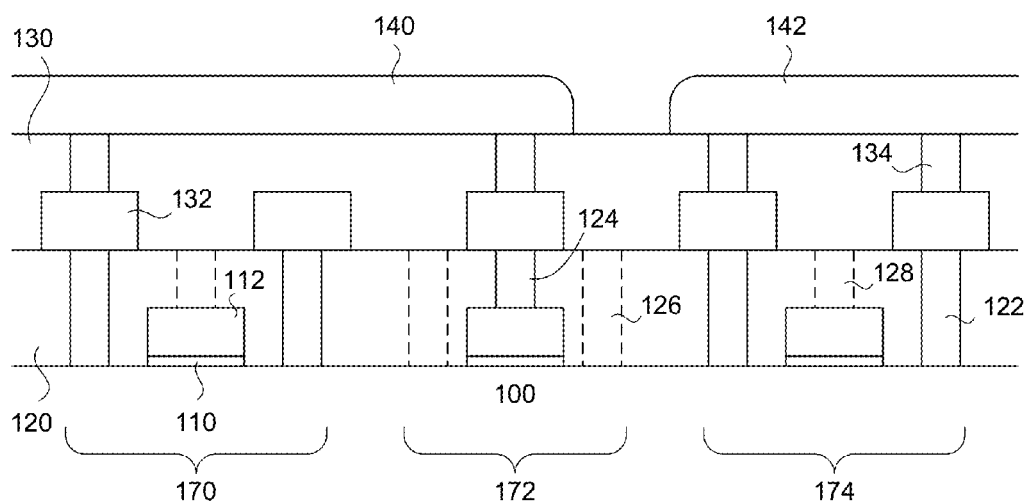
FIG. 2A shows a cross-section of a pre-formed transistor array with a first metal layer printed thereon according to one embodiment of the present invention.
Figure 2B:
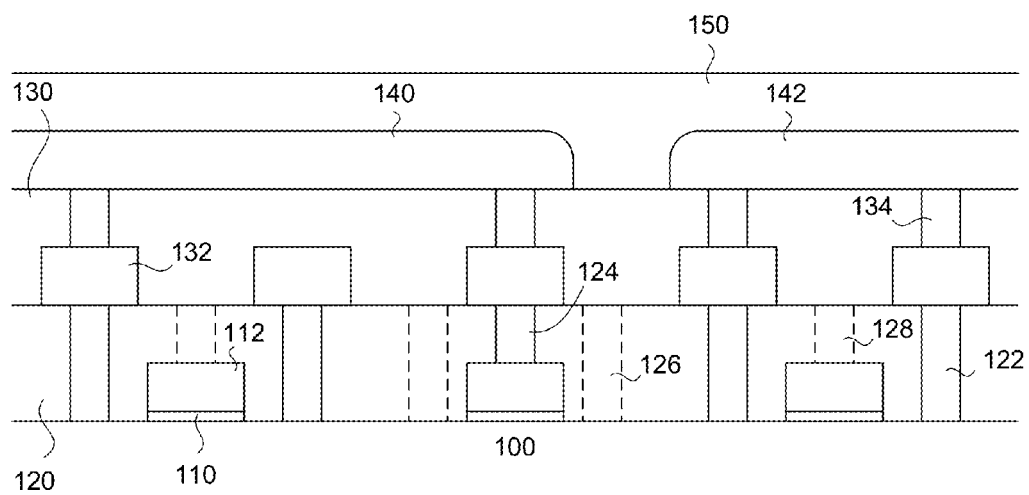
FIG. 2B shows a cross-section of the transistor array of FIG. 2A having a dielectric layer formed thereon according to the present invention.
Figure 2C:
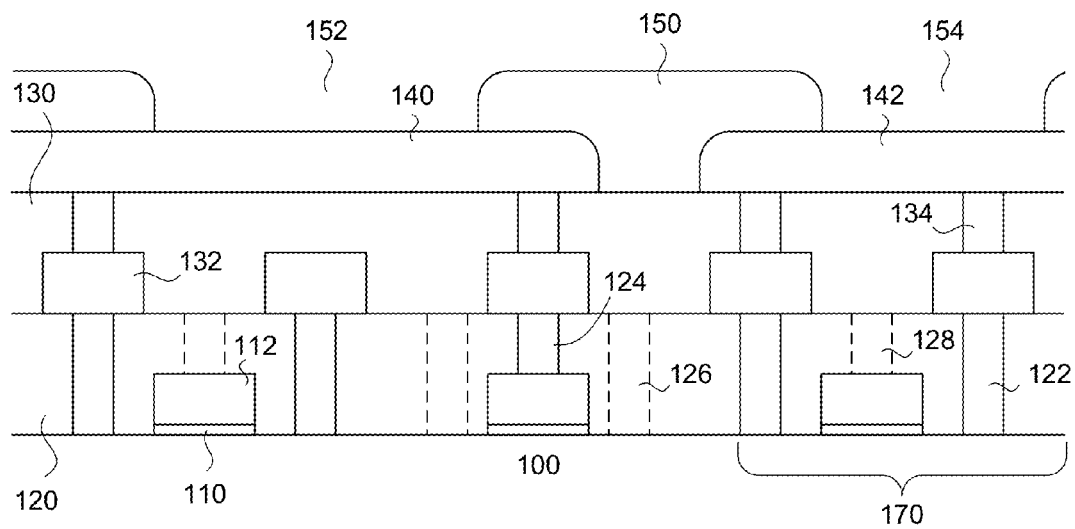
FIG. 2C shows a cross-section of the transistor array of FIG. 2B after the dielectric layer has been patterned to form contact openings therein.

Referring now to FIG. 2B, a dielectric layer 150 may be formed on the field-configured metal wires or lines 140/142 by blanket deposition (e.g., spin coating). As shown in FIG. 2C, a plurality of contact openings 152/154 are formed in the dielectric layer 150 to expose a surface of the underlying field-configured plurality of metal lines 140/142. This results in a patterned dielectric layer 150, as shown in FIG. 2C. In the alternative, a field-configured dielectric layer (e.g., patterned dielectric layer 15(Y) may be printed directly onto field-configured wires 140/142.

The patterned dielectric layer 150 and contact openings 152/154 therein may be formed by any suitable method. For example, the patterned dielectric layer 15(Y may be selectively deposited by inkjet printing, gravure printing, off-set lithography, screen printing, flexographic printing, microspotting, pen-coating, laser writing, syringe dispensing, and/or pump dispensing a desired dielectric precursor material Preferably, the patterned dielectric layer is formed by inkjet printing in the case of printing or dispensing, this may also serve the purpose of patterning the dielectric layer to form the contact openings. For example, in exemplary embodiments, the dielectric layer may be selectively deposited on one or more predetermined portions of the structure to form a desired pattern.

Specifically, in some implementations, the patterned dielectric layer 150' may be formed by printing a liquid-phase dielectric precursor ink on predetermined portions of the structure, and drying and/or curing the dielectric precursor ink to form the dielectric layer 150'. The liquid-phase dielectric precursor ink may be selectively printed on the structure such that contact openings 152/154 are formed therein to expose a portion of the metal lines or wires 140/142 as desired. In such methods, the contact openings 152/154 may be subsequently widened by etching techniques known in the art. Suitable liquid-phase dielectric precursor inks and methods of forming and printing such inks are discussed in copending U.S. patent application Ser. Nos. 11/888,942 and 12/249,735, respectively filed on Aug. 3, 2007 and Oct. 10, 2008, respectively), the relevant portions of which are incorporated by reference herein.

Referring again to FIG. 2B, in other embodiments, the dielectric layer 150 may be deposited over the entire device using any suitable method known in the art, and selected portions thereof removed (e.g., by conventional photolithography and etching) to form contact openings as desired. For example, blanket deposition of the second dielectric layer 150 may be performed by extrusion coating, blade coating, dip coating, linear coating, spin coating, or other coating technique, or in the alternative, by local deposition techniques such as printing or dispensing. In such embodiments, it may be desirable to deposit the dielectric layer with a sufficient thickness variation to enable a timed etch to open the contact openings over one or more predetermined areas, and only partially remove the dielectric layer in other predetermined areas. In some implementations, the etching process to form contact openings (e.g., 152/154 of FIG. 2C) may comprise laser ablation, mechanical penetration, or other etching or dielectric removal techniques known in the art. Furthermore, indirect patterning of the dielectric layer may be accomplished with a photo- and/or thermo-patternable precursor material that is exposed by a photomask, thermal or laser patterning, and development, or extrinsically via a patterning process such as conventional photolithography, embossing, or other similar technique.

In exemplary embodiments, the patterned dielectric layer 150' may further comprise an N- and/or a P-dopant. Furthermore, the patterned dielectric layer 150' may comprise an N-dopant in one or more first predetermined areas, and a P-dopant in one or more second predetermined areas. In such embodiments, the patterned dielectric layer may be formed by inkjet printing an N-doped dielectric precursor material in a first area of the device and a P-doped dielectric precursor material in a second area of the device using a printer having a plurality of inkjet heads. For example, an N-doped precursor material may be printed on an area of the device from a first inkjet head of a printer, and a P-doped dielectric precursor material may be printed in another area of the device from a second inkjet head of the same printer.

Suitable inks for printing a doped dielectric layer include compounds and/or polymers containing dopant and/or dielectric precursor atoms such as phosphorous and oxygen (which may further include silicon, carbon, hydrogen, and/or nitrogen), boron (which may further include silicon, carbon, hydrogen, oxygen, and/or nitrogen), arsenic and/or antimony (either of which may further include silicon, carbon, hydrogen, and/or oxygen, optionally in a suitable solvent (see e.g., U.S. patent application Ser. Nos. 11/818,078, 11/888,949, and 11/888,942, filed on Jun. 12, 2007, Aug. 3, 2007, and Aug. 3, 2007, respectively, the relevant portions of which are incorporated herein by reference. Exemplary dopant-containing dielectric compounds, including examples of precursors for a doped glass dielectric, are described in U.S. patent application Ser. No. 11/842,884, filed on Aug. 21, 2007, the relevant portions of which are incorporated herein by reference.

Referring again to FIG. 2C, the contact openings 152 and 154 in the patterned dielectric layer 150 expose the underlying patterned metal wires or lines 140 and 142 respectively. As previously discussed, the contact openings may be selectively formed by selectively printing the patterned dielectric layer 150' on the substrate. Alternatively, the contact openings 152/154 may be formed by conventional techniques (e.g., masking and etching, etc.) after the dielectric (e.g., 150 of FIG. 2B) is formed (e.g., by coating, spinning, blanket depositing, etc.) on the entire surface of the device.

Figure 2D:
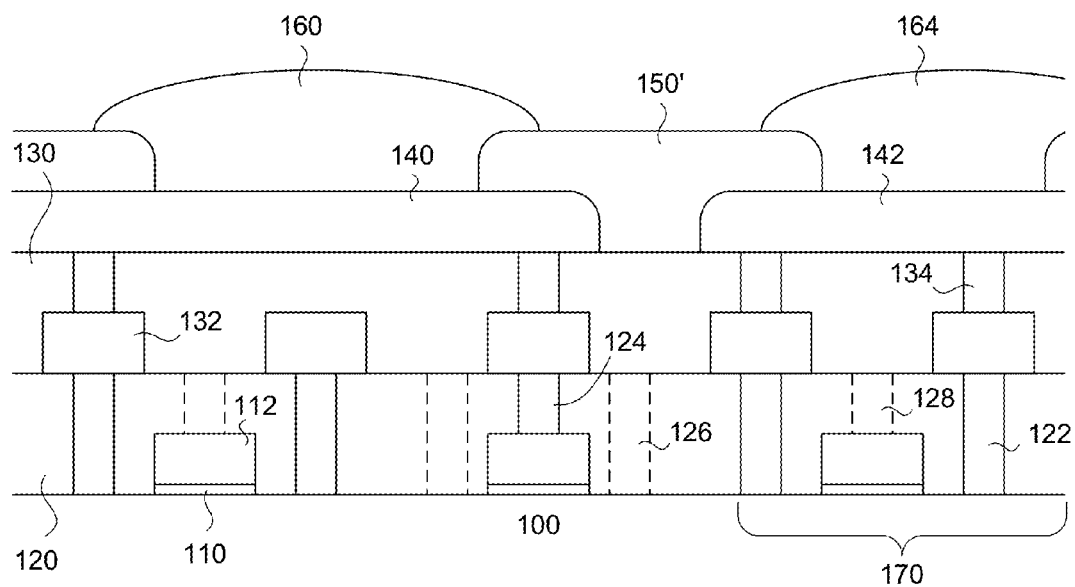
FIG. 2D shows a cross-section of the transistor array of FIG. 2C having metal lines printed on the patterned dielectric layer.

As illustrated in FIG. 2D, a second metal ink may be printed on the patterned dielectric layer 150 and in the contact openings 152/154. The ink may be conventionally dried and cured to form field-configured patterned metal lines 160 and 164 according to the methods previously described herein.

However, the present invention is not limited to the structure illustrated in FIGS. 2A-2D. On the contrary, many variations are possible. For example, in one example, one or more layers of patterned metal lines may be pre-formed on the substrate, and additional and alternating layers of dielectric material and metal wires and/or metal lines may be field-configured on the substrate as desired, using any suitable method described herein. Still, in other alternative embodiments, all of the layers of patterned metal lines may be field-configured, as it is not necessary to have any metallization layers pre-formed prior to field-configuring the circuit. In addition, a passivation layer may be deposited on the device. Exemplary materials for forming a passivation layer are described in detail below with regard to exemplary devices.

Similarly, the dielectric layers may be included as part of the pre-formed substrate, or in the alternative, the dielectric layers may be field-configured as described herein. For example, the first dielectric layer may be pre-formed on the transistor array, and subsequent dielectric layers field-configured (e.g., by printing). In another embodiment, the first two dielectric layers may be pre-formed, with additional layers configured in the field. In addition, the same is true for the contact openings in the dielectric layer. Contact openings formed in an uppermost pre-formed dielectric may be pre-formed in the factory, or alternatively, may be field-configured according to the desired wiring pattern. However, in preferred embodiments, at least one dielectric layer is pre-formed on the transistor array.

In addition, printers (e.g., inkjet printers) and other inexpensive deposition equipment (e.g., spin-coaters) can be adapted for printing dielectric and metal layers. Furthermore, software can be made to design such printed layouts (e.g., dielectric layer patterns and/or metal interconnections) and control the printing process as previously discussed with regard to exemplary methods and software for fabricating a field configurable integrated circuit. Consequently, the configurable circuit devices made according to the present method may be customized, thus meeting the needs of the customer and minimizing production costs.

Exemplary Pre-Formed Substrates

Referring again to FIG. 2A, a pre-formed array of transistors are generally on the substrate 100. In various implementations, the substrate may comprise a single crystal silicon wafer, a metal sheet, a metal foil, a plastic sheet, a plastic film a plastic web, a glass sheet or a glass slip, or any other suitable substrate. Alternatively, the transistors may include an inorganic or organic semiconductor (e.g., a-Si, ZnS, CdSe or ZnO, or a [poly]thiafulvene organic semiconductor).

Figure 3:
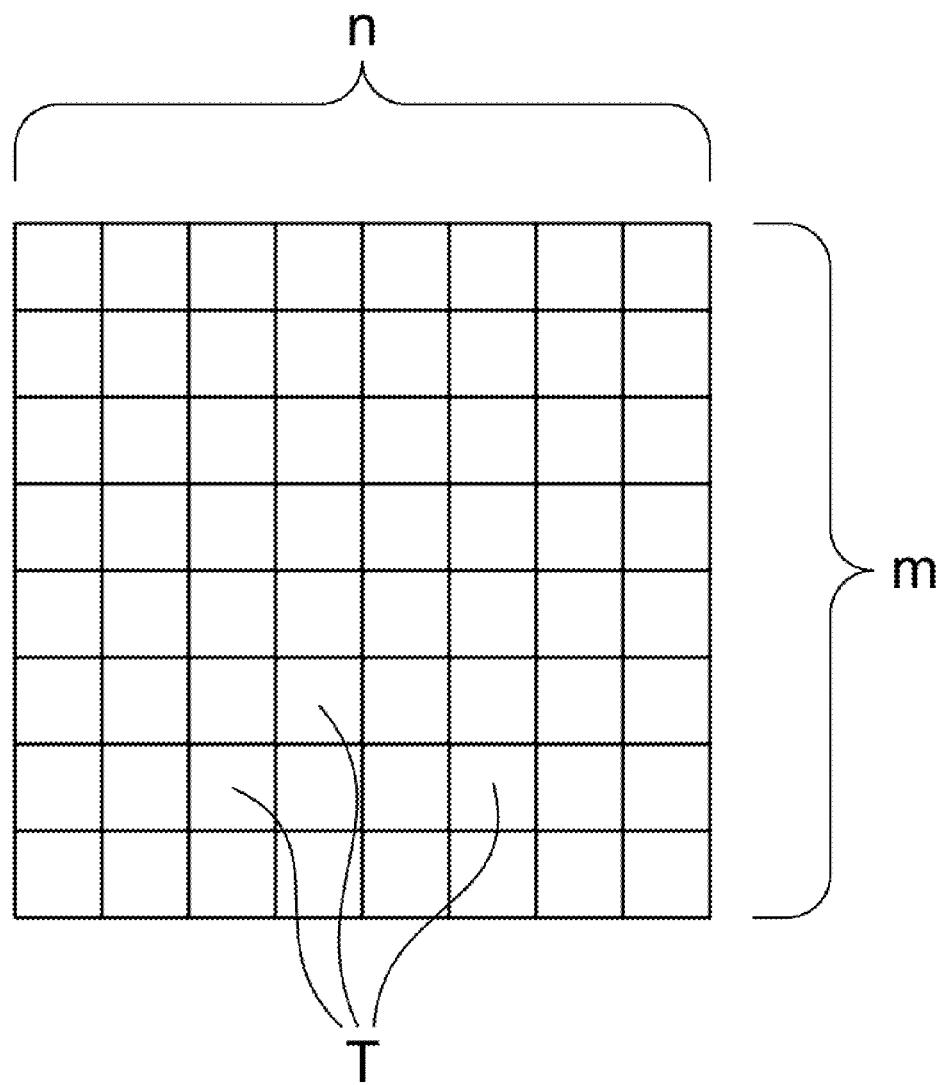
FIG. 3 shows an exemplary transistor array arrangement according to embodiments of the present invention.

An exemplary array according to an embodiment of the present invention is shown in FIG. 3. As seen in FIG. 3, the transistors may be arranged in an array comprising a plurality of rows and a plurality of columns. For example, the array may comprise m rows and n columns, where in and/or n are integers of at least $2^k$, wherein k is an integer greater than or equal to 1 (e.g., 2, 3, 4, 5 or more). The array of FIG. 3 shows an array with 8 columns and 8 rows. However, the invention is not limited as such. The array may have any number of rows and columns as desired. Generally, and as shown in FIG. 3, each intersection of one row and one column defines a location of one transistor T in the array. Alternatively, the array of transistors may have an irregular shape.

In one exemplary embodiment, the transistors in the array comprise thin film transistors (see, e.g., FIG. 4A), in addition, one or more capacitors, diodes, resistors, inductors, and/or other structures may also be formed on the substrate as desired, and field-configured into a circuit function block or logic element as desired. Thus, in some embodiments, the pre-formed patterned metal lines and/or the printed/field-configured pattern(s) of metal wires may electrically connect at least one of transistors in the array to one or more capacitors, diodes, and/or inductors that may also have been pre-formed on the substrate.

Referring again to FIG. 2A, the substrate 100 may also include a pre-formed dielectric layer 120 thereon. The pre-formed dielectric layer 120 may also have a plurality of contact openings (e.g., in locations corresponding to contact plugs 122, 124, 126, 128) exposing a surface of the terminals of the transistors in the array and/or other devices on the substrate. Suitable materials for forming the dielectric layer are discussed in detail below with regard to exemplary devices. The contact openings in the pre-formed dielectric layer 120 may contain a metal (e.g., metal plugs 122, 124, 126, 128 in FIG. 2A) therein for electrically connecting underlying and overlying patterned metal lines, transistors, or other circuit components on the substrate.

In embodiments where the substrate is manufactured at one location (e.g., a wafer fab), bit field-configured at another location (e.g., a customer's lay, prototyping facility, etc.), the substrate may comprise a layer of removable protective material (e.g., plastic, photoresist, etc.) on the pre-formed dielectric 120 that may be selectively and substantially completely removed prior to field configuration. Preferably, the removable material is removed without adversely affecting the dielectric and structures exposed by the contact openings thereon. For example, any plastics, photoresists, or other organic materials can be selectively removed with one or more organic solvent(s), without adversely affecting underlying inorganic materials. Similarly, a metal protective layer can be removed with aqueous acid, or a silicon nitride protective layer can be removed with hot aqueous phosphoric acid ($H_3PO_4$), etc. In general, protective material protects materials exposed through contact openings from air and other oxidants and/or contaminants.

In still another embodiment, the pre-formed pattern of metal lines may comprise a damascene metal. In such embodiments, a second dielectric layer is on the first pre-formed dielectric layer, and the pattern of damascene metal lines is in a pattern etched into the second dielectric layer. For example, in one embodiment, a second dielectric layer (e.g., 130 of FIG. 2A) may be blanket-deposited on the first dielectric layer (e.g., 120 of FIG. 2A), and then the second dielectric layer is subsequently patterned (e.g., by etching). The metal may be deposited thereon, including in the trenches etched into the second dielectric layer (e.g., 130 of FIG. 2A). In preferred embodiments, the damascene metal comprises or consists essentially of copper. In other embodiments, the device may comprise a second pre-formed dielectric on the pre-formed pattern of metal lines. The second pre-formed dielectric may include contact openings pre-formed therein, or in the alternative, the holes in the second pre-formed dielectric layer may be formed in the field. The device may have any number of alternating pre-formed dielectric layers and/or pre-formed patterns of metal lines, as needed or desired.

Figure 4A:
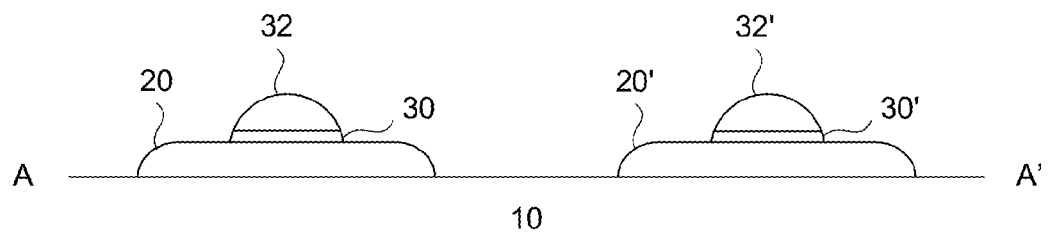
FIGS. 4A-4B show cross-sectional and top-down views, respectively, of an exemplary pre-formed transistor array manufactured according to one embodiment of the present invention.
Figure 4B:
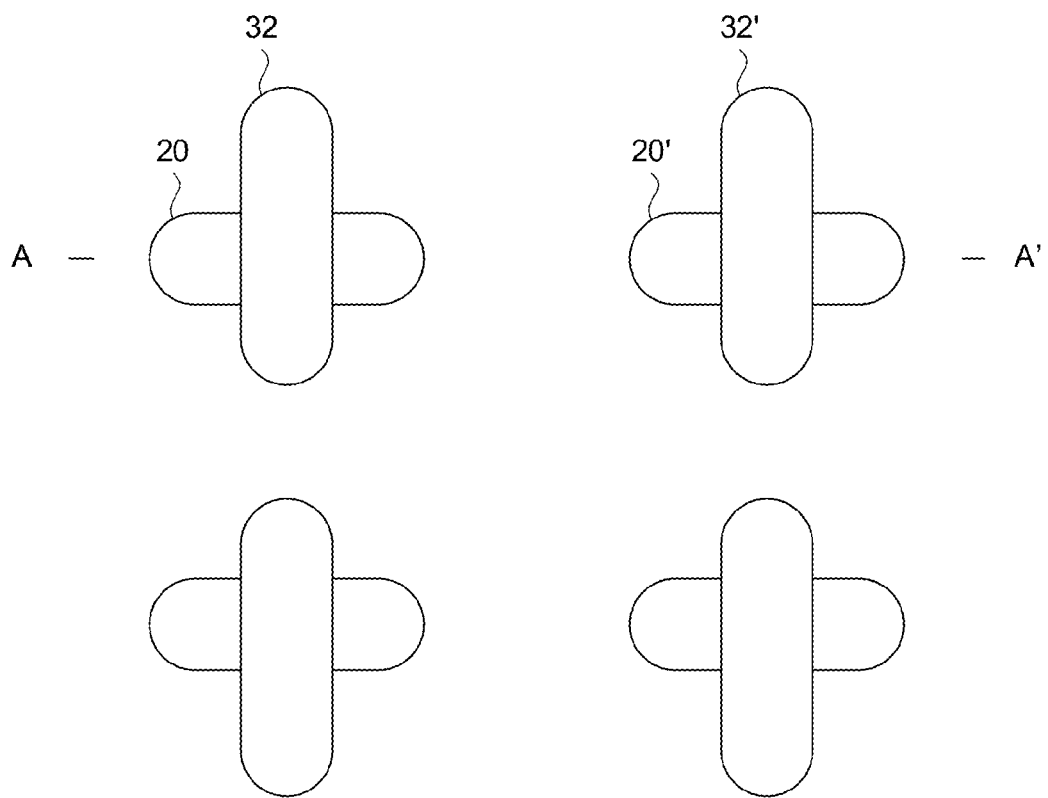

In another alternative embodiment of the present method, the transistor array may also be pre-formed using the printing techniques described herein. This alternate embodiment is illustrated in FIGS. 4A-49. Specifically, a cross-section of an exemplary transistor array according to this embodiment is shown in FIG. 4A, and a top-down view of the same is shown in FIG. 4B. A plurality of silicon active islands 20 and 20' are formed on a substrate 10 by printing techniques as previously described herein. Suitable methods for printing silicon are described in detail in U.S. Pat. No. 7,485,691, and co-pending U.S. patent application Ser. No. 10/789,317, filed Feb. 27, 2004, the relevant portions of each of which are incorporated by reference herein. Gate oxides 30 and 30' are then formed on respective silicon islands 20 and 20', and silicon gates 32 and 32' are printed thereon. The transistors shown in FIGS. 4A and 4B represent transistors in an m-by-n array (e.g., as shown in FIG. 3) of silicon islands and gates. However, the invention is not limited to such an array. The method described herein can be applied to irregular arrays as well.

Figure 4C:
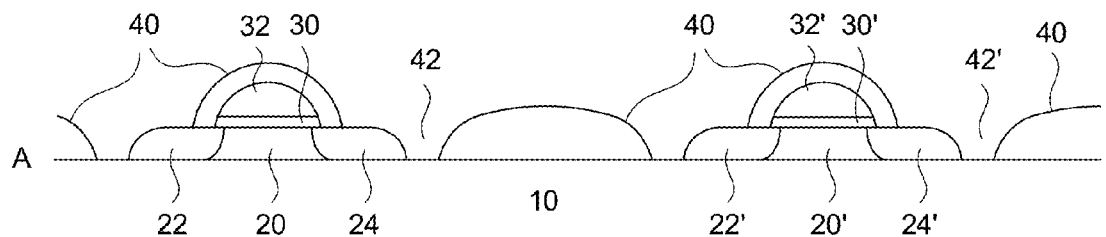
FIGS. 4C-4D show cross-sectional and top-down views, respectively, of the transistor array of FIGS. 4A-4B having a dielectric layer formed thereon according to exemplary methods of the present invention.
Figure 4D:
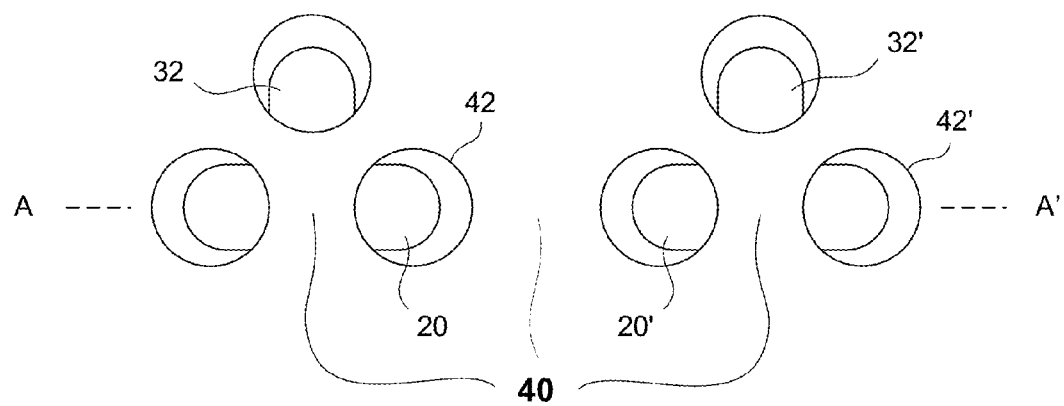
Figure 4D:
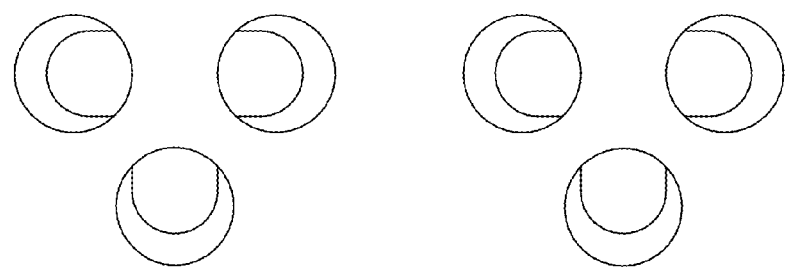

Referring now to FIGS. 4C and 4D (cross-sectional and top-down views, respectively), source and drain terminals 22/22' and 24/24' are formed in silicon islands 20/20', and a dielectric layer 40 is formed (e.g., by printing) on the substrate 10 using any of the blanket deposition, etching and/or printing processes described herein. In one embodiment, the dielectric layer 40 may further comprise a dopant that can be diffused into silicon islands 20 and 20', especially when it is blanket-deposited or otherwise formed on substantially the entire island 20/20'. In the alternative, source and drain terminals 22/22' and/or 24/24' can be formed by conventional ion implantation prior to deposition/printing of the dielectric layer 40. Contact openings 42 and 42' are formed in the dielectric layer 40 to expose the transistor terminals.

The contact openings may be formed as a pattern during the dielectric printing process, or by conventional methods (e.g., by masking and etching) after the dielectric layer has been deposited over the substrate. For example, in one embodiment, the dielectric layer 40 may be selectively printed in a pattern covering portions of the underlying transistors (and/or patterned metal wires) while also exposing other portions such that contact openings 42/42' are selectively formed in the pattern. In other embodiments, the dielectric layer(s) 40 may be printed, coated, or blanket deposited on the substrate, and then portions removed to form the contact openings 42/42' using methods known in the art (e.g., masking and etching).

Figure 4E:
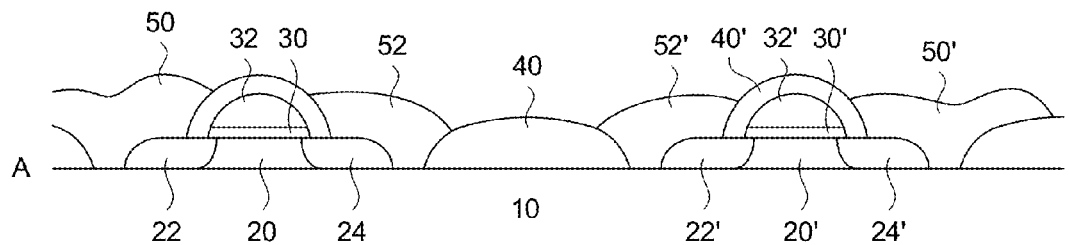
FIGS. 4E-4F show cross-sectional and top-down views, respectively, of a plurality of metal lines formed on the transistor array of FIGS. 4C-4D in accordance with embodiments of the present invention.
Figure 4F:
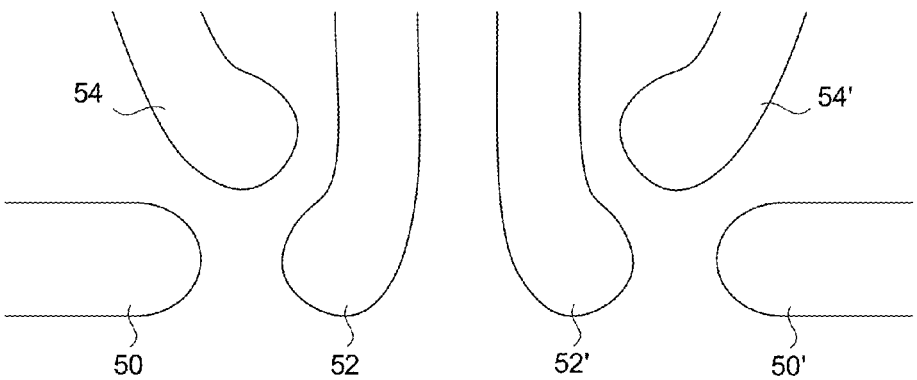
Figure 4F:
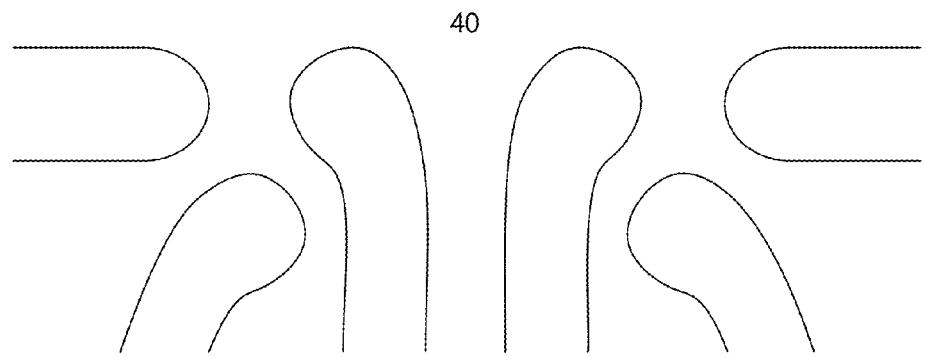

FIGS. 4E and 4F respectively show a cross-section and a top-down view of field-configured metal lines 50, 50', 52, 52', 54, and 54' on the substrate 10. The metal lines are connected to the gates 32/32' and source/drain terminals 22/22' and 24/24' shown in FIGS. 4A-4D. If it is desired to cross-couple one or more terminals 22, 22', 24, 24', 32 and/or 32' to each other and/or to other similar terminals, such coupling can easily be done by one skilled in the art (also see the Examples discussed below with respect to FIGS. 5A-6B).

However, the embodiment of FIGS. 2A-2D may be advantageous over an all-printed scheme, because at least the polysilicon layer, the first dielectric, and optionally the lower-most patterned metal layer may be fabricated in advance using conventional CMOS process technology, including relatively mature, low-cost technologies (e.g., 0.35 µm minimum line width or greater). However, as previously explained, prefabrication is not limited to only the first dielectric and optionally the lower-most pattern metal layer. In various embodiments, one or more metal layers may be prefabricated as desired or needed. In addition, in a given layer of metallization, the metal layer in one region of the substrate (e.g., logic circuitry) can be fabricated by photolithography or damascene processing, and printed in another region (e.g., to form a ROM or other memory).

Exemplary Devices

The above-described general methods, and the variations and embodiments thereof, may be used to manufacture exemplary devices as described herein. An exemplary device according to the present invention is shown in FIG. 2D. In general, an exemplary device according to the present invention comprises a substrate 100 with an array of transistors 170, 172 and 174 (e.g., comprising a gate dielectric 110, a gate electrode 112, and a plurality of source/drain terminals) thereon, and a pre-formed dielectric layer 120 on the substrate having a first plurality of contacts 122, 124, 126, and 128 therein. Each contact electrically connects a transistor terminal (e.g., gate 112) on the substrate to an overlying metal layer (e.g., 132). A first layer of (optionally pre-formed) patterned metal wires or lines 132 is on the first dielectric layer 120, and a second (optionally pre-formed) dielectric layer 130 is on the first layer of patterned metal wires 132. The second dielectric layer has a second plurality of contacts 134 therein. The second plurality of contacts electrically connects one or more metal wires in the (pre-formed) patterned metal wires 132 to a field-configured (e.g., printed) pattern of metal lines 140/142 on or over the second dielectric layer 130.

Additional and alternating layers of field-configured metal wires and field-configured dielectric layers may be formed on the device as desired. For example, the device shown in FIG. 2D further comprises a field-configured dielectric layer 150', patterned to have a plurality of contact openings 152/154 exposing one or more field-configured metal lines 140/142. A second field-configured plurality of patterned metal lines 160/164 is printed on the patterned dielectric layer 150', in electrical contact with the field-configured (e.g., printed) metal lines 140/142. In the example shown in FIG. 2D, the second field-configured plurality of patterned metal lines 160/164 have a long axis that is orthogonal to that of the first field-configured metal lines 140/142. However, it is not required that any field-configured metal line have a regular pattern or shape.

However, as discussed with regard to exemplary methods for fabricating a field configurable circuit, the device may have additional field-configured dielectric layers and metal lines. In addition, one or more patterned metal line layers may be pre-formed in the factory. Such pre-formed metal layers are optional, and are not required. In exemplary embodiments, all of the pattern metal lines or wires are field-configured using the methods and techniques described herein. Similarly, one or more dielectric layers on the device may be pre-formed, and additional dielectric layers subsequently formed and configured in the field as needed.

The substrate may comprises any suitable material as previously discussed herein, and may further comprise one or more capacitors, diodes, inductors, transistors, and/or other structures on the substrate. The array of transistor may comprise a plurality of rows and a plurality of columns as previously discussed with regard to FIG. 3.

In embodiments comprising a printed array of transistors as previously discussed with regard to FIGS. 4A-4B, the transistors may comprise an organic semiconductor and/or an inorganic semiconductor. For example, in various embodiments, the semiconductor may comprise or consist essentially of an inorganic semiconductor material, such as one or more Group IVA elements (e.g., silicon and/or germanium), a Group III-V material (e.g., GaAs), a II-VI (or chalcogenide) semiconductor, etc., which may further contain a dopant (such as B, P, As, or Sb). The dopant may be present in a light dose (e.g., in a concentration of from $\sim 10^{16}$ to $\sim 5 \times 10^{18}$ atoms/cm$^2$), or a heavy dose (e.g., from about $10^{19}$ to about $10^{21}$ atoms/cm$^3$). If a doped semiconductor is formed from an ink containing one or more (doped) molecular and/or nanoparticle-based silicon/germanium precursors, the doped semiconductor may have a concentration profile (e.g., dopant concentration as a function of semiconductor layer thickness) in an amorphous state that is substantially uniform throughout substantially the entire thickness of the semiconductor.

In general, the thickness of the semiconductor may be from about 10, 25, 50, or 100 nm to about 200, 500, or 1000 nm, or any range of values therein. The thickness may be chosen to optimize the electrical properties of the transistors in the array. In addition, the semiconductor may have a width of at least 1, 2, 5, or 10 µm, up to 20, 50, 100, or 200 µm, or more, or any range of values therein.

Whether pre-formed or field-configured, the dielectric layer(s) may comprise any suitable electrically insulative dielectric material. For example, the dielectric layer(s) may comprise oxide and/or nitride ceramics or glasses (e.g., silicon dioxide, silicon nitride, silicon oxynitride, aluminum oxide, tantalum oxide, zirconium oxide, etc.), polymers such as polysiloxanes, parylene, polyethylene, polypropylene, undoped polyimides, polycarbonates, polyamides, polyethers, copolymers thereof, fluorinated derivatives thereof, etc.

In some embodiments, the dielectric layer(s) comprise an inorganic insulator. For example, the dielectric may comprise an oxide and/or nitride of the formula $M_xO_yN_z$, wherein M is silicon or a metal selected from the group consisting of aluminum, titanium, zirconium, tantalum, hafnium, vanadium, chromium, molybdenum, tungsten, rhodium, rhenium, iron, ruthenium, copper, zinc, indium, tin, a lanthanide metal, an actinide metal, and mixtures thereof. In further embodiments, the inorganic insulator may comprise silicates, aluminates, and/or aluminosilicates of such metals and mixtures, where M includes Si and/or Al and the sum (y/2+z/3) is equal to the combined oxidation state of the x instances of M.

The dielectric layer(s) may be formed from a liquid-phase dielectric precursor ink. When the dielectric layer comprises SiO$_2$ or a silicate, the liquid-phase dielectric precursor ink may comprise a compound of the formula $Si_nH_y$, where n is from 3 to 12, and y is an even integer of from n to 2n+2, and preferably a compound of the formula $(SiH_z)_n$, where n is from 4 to 10, and each of the n instances of z is independently 1 or 2. A corresponding silicon oxide film may be formed by curing the precursor ink (e.g., by annealing).

In exemplary embodiments, the dielectric layer(s) may comprise a spin on glass (which may be photodefinable or non-photodefinable; in the latter case, the glass may be patterned by direct printing or post-deposition lithography); a polyimide (which may be photodefinable and/or thermally sensitized for thermal laser patterning, or non-photodefinable for patterning by direct printing or post deposition lithography); BCB or another organic dielectric such as SiLK® dielectric material (Dow Chemical Co., Midland, Mich.); a low-k dielectric formed by a sol-gel technique; plasma enhanced (PE) TEOS (i.e., SiO$_2$ formed by plasma-enhanced CVD of tetraethylorthosilicate); or a laminated polymer film of materials such as polyethylene (PE), polyester, or higher temperature polymers such as polyethylene sulfone (PES), polyimide or others that are compatible with subsequent high temperature processing.

In other implementations, the dielectric layer(s) comprise an oxide and/or nitride of a Group IVA element, which may further comprise conventional boron and/or phosphorous oxide modifiers in conventional amounts. The Group IVA element may comprise or consist essentially of silicon, in which case the dielectric layer(s) may comprise or consist essentially of silicon dioxide, silicon nitride, silicon oxynitride, a borosilicate glass, a phosphosilicate glass, or a borophosphosilicate glass (preferably silicon dioxide). The dielectric layer(s) may have a thickness of at least 1 µm (e.g., 2 to 25 µm, 5 to 10 µm, or any other range of values therein).

The pre-formed and/or field-configured (e.g., printed) pattern of metal lines may generally comprise any electrically conductive metal or metal alloy, as described herein. In various embodiments the field-configured (e.g., printed) pattern of metal lines may fill some or all of the plurality of contact openings in the dielectric layer(s). In still other embodiments, the printed metal lines may comprise a seed layer and a bulk conductive layer, as previously discussed with regard to exemplary methods of forming a field-configurable metal layer.

In some embodiments, the device further comprises a passivation layer. The passivation layer may be formed by conventionally coating the upper surface of the structure with one or more inorganic barrier layers, such as a polysiloxane and/or a nitride, oxide and/or oxynitride of silicon and/or aluminum, and/or one or more organic barrier layers such as parylene, a fluorinated organic polymer (e.g., as described above), or other barrier material known in the art. Alternatively or additionally, the passivation layer may comprise a bi-layer dielectric. The underlying dielectric layer may be formed from a material having lower stress than that of the overlying passivation layer. To illustrate, the underlying dielectric layer may comprise an oxide (e.g., $SiO_2$, TEOS, undoped silicate glass [USG], fluorosilicate glass [FSG], borophosphosilicate glass [BPSG], etc.), and the overlying passivation layer may comprise silicon nitride or a silicon oxynitride. In some embodiments, the passivation layer may have a thickness that is slightly greater than the thickness of the dielectric layer.

As previously discussed herein, any of the structures and/or layers of the device may be pre-formed or pre-made in a factory using conventional or printing processes known in the art. Such pre-formed devices may be customized to include any structures or circuit components (e.g., transistors, resistors, diodes, capacitors, inductors, combinations thereof, etc. in regular and/or irregular arrays), as desired by a consumer and/or partner. The circuit may then be electrically configured and completed by a consumer and/or partner in the field (generally using printing techniques). Thus, a device or product may comprise any number or combination of alternating dielectric layers, patterned metal wires, and/or printed patterns of metal lines as desired, which results in custom, specific, and possibly unique electrically functional circuits and products.

EXAMPLES

Embodiments of the present invention may be used to manufacture circuit functions and logic gates, such as NAND gates, NOR gates, or the like. For example, FIGS. 5A-5D illustrate an exemplary NAND gate 500 in accordance with the present method. In FIGS. 5A-5D, white areas and/or structures generally represent non-conductive regions of the device, whereas shaded areas and/or structures generally represent conductive regions of the device.

Figure 5A:
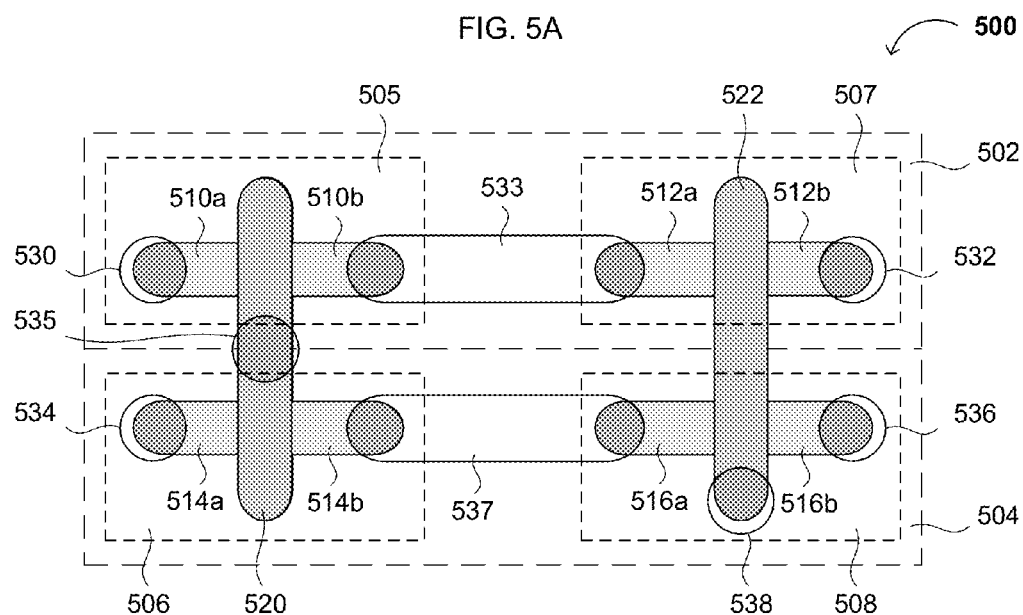
FIGS. 5A-5D show an exemplary NAND gate and gate structures for making the same according to the present invention.

In FIG. 5A, a pre-formed array of transistors (e.g., including 505, 506, 507, and 508) are on a substrate. Each transistor in the array has source and drain regions (e.g., 510a, 510b, 512a, 512b, 514a, 514b, 516a, and 516b), and pairs of transistors in the array may share a common gate (e.g., 520 or 522). A first transistor in each pair may be a PMOS transistor (represented by PMOS region 502 of FIG. 5A), and the other transistor in each pair may be an NMOS transistor (represented by NMOS region 504 of FIG. 5A). A first pre-formed dielectric layer (not shown) is on the transistor array and the substrate. Contact openings (i.e., 530, 532, 534, 535, 536, and 538) and/or interconnect openings (533 and 537) are generally formed in the first dielectric layer to facilitate electrical connection with the transistor terminals in the array. In general, the stage of the manufacturing process in FIG. 5A is the same stage represented in FIGS. 4C and 4D.

Figure 5B:
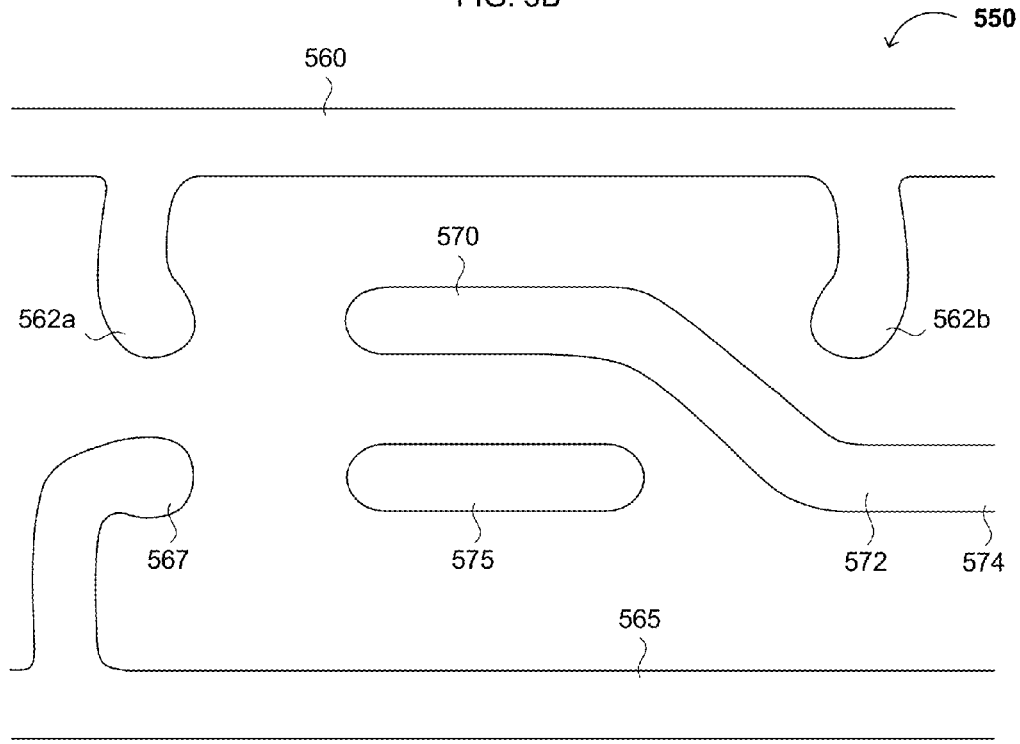

The device of FIG. 5A may be sent to another entity (e.g., a customer and/or partner) to complete the circuit in the field, as previously described herein. For example, after the desired circuit layout has been generated and/or corrected, as described above with regard to FIG. 1, a first pattern of metal lines or wires 550 is field-configured (e.g., by printing) on the first dielectric layer, as shown in FIG. 5B. Optionally (but preferably), the dielectric layer and/or the exposed transistor terminals are cleaned and/or pre-treated prior to deposition of the metal. For example, native oxide may be removed from silicon-based transistor terminals by a buffered oxide etch. Any protective layer on the dielectric layer and in the contact openings must be removed prior to deposition of metal to form the first metal wire pattern 550. The first pattern of metal wires or lines 550, including metal lines 560, 565, and 574; contacts 562a, 562b, 567, and 572; and local interconnects 570 and 575, may be printed (e.g., by inkjet printing, gravure printing, or other method as described herein) on the first dielectric layer and in the contact openings according to the desired circuit layout. In general, the stage of the manufacturing process in FIG. 5B is the same stage of the process represented in FIGS. 4E and 4F.

Referring again to FIG. 5B, metal line 560 provides a first power supply (e.g., Vdd) through contact opening 530, and is connected to the PMOS transistors 505 and 507 at terminals 510a and 512b through contacts 562a and 562b in contact openings 530 and 532, respectively. Line 565 provides a second power supply or ground potential (e.g., Vss) and is connected to NMOS transistor 506 at terminal 514a through contact 567 in contact opening 534, Local interconnect 575 connects adjacent NMOS transistors 506 and 508 at terminals 514b and 516a, respectively. Local interconnect 570 connects adjacent PMOS transistors 505 and 507 at terminals 510b and 512a, respectively, and then connects to NMOS transistor 508 at terminal 516b through contact 572 in contact opening 536. The NAND gate output is provided via metal line 574 in FIG. 5B.

Figure 5C:
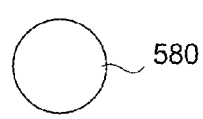
Figure 5C:
Figure 5D:
Figure 5D:
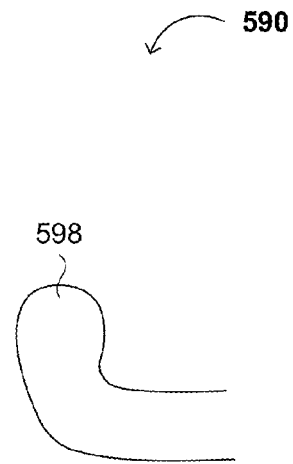

As shown in FIG. 5C, a second dielectric layer having contact openings 580 and 585 therein may be formed on the first pattern of metal lines (i.e., 550 of FIG. 5B) using any of the methods described herein. In general, the contact openings 580 and 585 correspond to or expose the underlying contact openings 535 and 538 in the first dielectric layer (FIG. 5A). As shown in FIG. 5D, a second patterned layer of metal wires 590 may be printed on the second dielectric layer and in the contact openings (580 and 585 of FIG. 5C) therein. The second patterned layer of metal lines 590, electrically connected to the gates 520 and 522 of the transistors 502-508 (FIG. 5A) through the contact openings 580 and 585 of FIGS. 5C and 535 and 538 in FIG. 5A, receives the logic inputs to the NAND gate. Although not shown in the figures, additional layers of dielectric material and metal lines may be added according to the methods described herein as desired. In addition, the method is not limited to the two-layer process shown in FIGS. 5A-5D. On the contrary, the process as described with regard to FIGS. 5A-5B may be implemented in a single layer process as well. In a further alternative embodiment, power supply and ground buses can be routed in metal layers separate from the inputs and output of the NAND gate and/or from each other to minimize interference effects and/or noise.

Figure 6A:
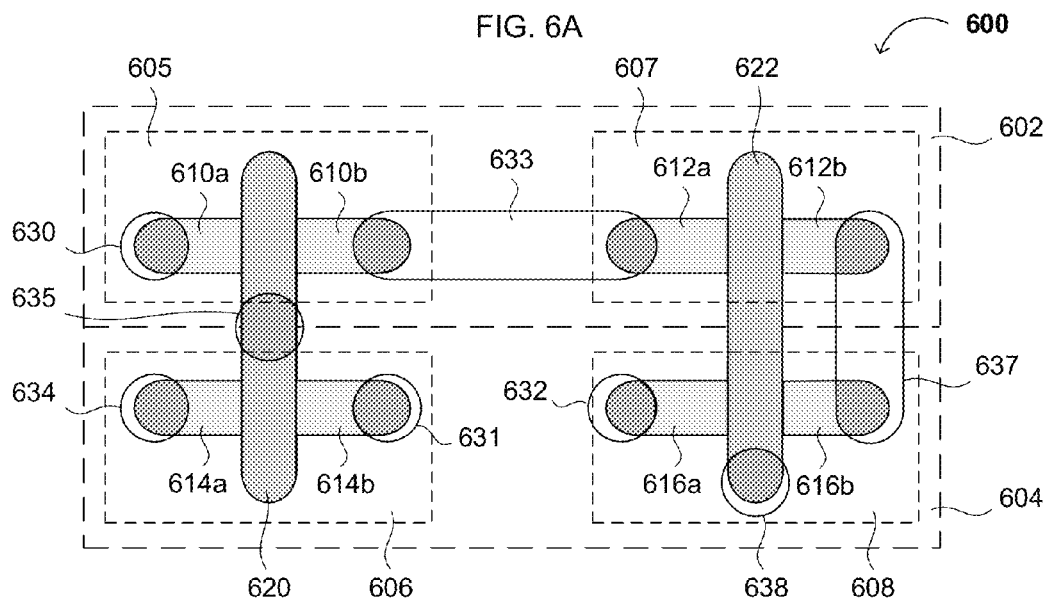
FIGS. 6A-6B show exemplary NOR gate and intermediate structures for making the same according to the present invention.
Figure 6B:
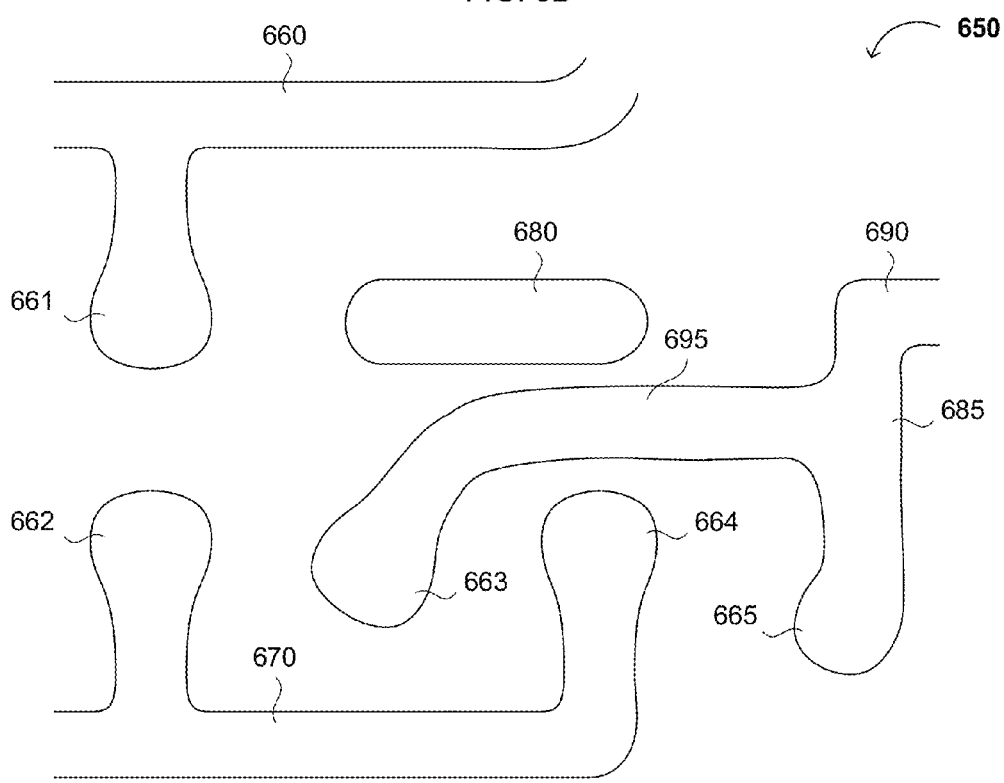

In a second example, a NOR gate may be customized and manufactured as shown in FIGS. 6A-6B. As previously explained with regard to FIGS. 5A-5D, white areas and/or structures in FIGS. 6A-6B generally represent non-conductive regions of the device, and shaded areas and/or structures in FIGS. 6A-6B generally represent conductive regions of the device. In FIG. 6A, a pre-formed array of PMOS transistors 605 and 607, and NMOS transistors 606 and 608 are on a substrate, similar to FIG. 5A. Each transistor in the array has source and drain regions (e.g., 610a, 610b, 612a, 612b, 614a, 614b, 616a, and 616b). Transistors 605 and 606 share common gate 620, and transistors 607 and 608 share common gate 622. The PMOS transistors 605/607 are present in the upper (PMOS) region 602 of FIG. 6A, and NMOS transistors 606/608 are present in the lower (VMS) region 604 of FIG. 6A. A pre-formed first dielectric layer (not shown) is on the transistor array and the substrate. Contact openings (e.g., 630, 631, 632, 634, 635, and 638), and interconnect openings 633/637 are in the first dielectric layer as described herein.

Referring now to FIG. 6B, in a similar process described with regard to FIG. 5B, a first pattern of metal lines or wires 650 is field-configured (e.g., by printing) according to a predetermined pattern, which may be computer generated as described with regard to FIG. 1 above. The first pattern of metal lines 650 may be formed (e.g., by printing) on the first dielectric layer, and in the contact openings and interconnect openings, to form contacts 661, 662 663, 664, and 665 and interconnects 680 and 685/695 interconnecting various transistor terminals on the substrate as shown.

Specifically, metal line 660 provides a first power supply (e.g., Vdd) through contact opening 630, and is connected to the PMOS transistor 605 at terminal 610a. Line 670 provides a second power supply or ground potential (e.g., Vss), and is connected to NMOS transistors 606 and 608 at terminals 614a and 616a through contacts 662 and 664 in contact openings 632 and 634. Local interconnect 680 connects adjacent PMOS transistors 605 and 607 at terminals 610b and 612a. Local interconnect 685/695 connects NMOS transistors 606 and 608 at terminals 614b and 616b to PMOS transistor 607 at terminal 612b. Line 695 crosses over gate 622, but is separated therefrom by the dielectric layer (not shown). The NOR gate output is provided via metal line 690 in FIG. 6B. FIGS. 5C and 5D can also be used for inputs to the NOR gate configured as shown in FIGS. 6A-6B. The two-layer process shown in FIGS. 6A-6B and the corresponding description thereof is not limited as such, and may also be implemented in a single layer process. In a further alternative embodiment, power supply and ground buses can be routed in metal layers separate from the inputs and output of the NAND gate and/or from each other to minimize interference effects and/or noise.

CONCLUSION/SUMMARY

Thus, the present invention provides semiconductor devices and methods for forming semiconductor devices that enable production of customized products while minimizing production steps, and reducing production costs. The use of deposition and patterning methods to form semiconductor, metal, and/or dielectric layers on a substrate where one or more device circuit components are pre-made in a factory, but which require further processing to yield an electrically functional circuit and/or product, allows a customer or partner to manufacture custom-specific and/or unique electrically functional circuits/products without the expense and complexity of a full fabrication process.

A first aspect of the present invention relates to a method for field-programming an integrated circuit comprising the steps of (1) entering or inputting design logic and/or functions into a computer configured to design and correct one or more circuit layouts, (2) designing one or more circuit layouts, (3) correcting the circuit layouts, and (4) printing one or more metal layers and one or more dielectric layers on a transistor array and a first dielectric layer pre-formed on a substrate according to the corrected circuit layout.

In a second aspect, the present invention relates to a method for fabricating a field configurable circuit by depositing (e.g., by printing) a first metal ink on or over a substrate according to a predetermined wiring pattern. The substrate has a pre-formed array of transistors and a pre-formed first dielectric layer on the array with a first plurality of contact openings formed therein. The contact openings expose a surface of each terminal of the transistors. The predetermined wiring pattern enables predetermined functionality and/or logic in a circuit, which includes the transistors and the wiring pattern. After the first metal ink is deposited on the substrate, a first plurality of patterned metal lines may be formed from the metal ink. Additional dielectric layers, metal wires, and/or metal lines may be similarly formed on the substrate by alternately depositing dielectric layers having contact openings therein, and then depositing metal ink on the dielectric layer(s) to form metal wires or lines.

A third aspect of the present invention relates to a device comprising (1) a substrate with an array of transistor thereon, (2) a dielectric layer on the substrate having a first plurality of contact openings therein, each contact opening exposing a transistor terminal, (3) a first layer of patterned metal wires electrically connected to the terminals of the transistors in the array, (4) a second dielectric layer on the first metal layer having a second plurality of contact openings therein, the contact openings exposing a surface of the first layer of patterned metal wires, and (5) a first printed pattern of metal lines thereon or thereover. The device may include additional dielectric layers alternating with additional metal wires and/or metal lines. The various metal wires and/or metal lines may be electrically connected to one or more of the other metal wires and/or metal lines in the device through contacts in the contact openings of the dielectric layers. Furthermore, the device may also include one or more capacitors, diodes, inductors, and/or transistors on the substrate.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of field programming an integrated circuit, comprising:
   a) inputting logic and/or circuit functions into a computer configured to design one or more circuit layouts;
   b) designing the one or more circuit layouts from the logic and/or circuit functions; and
   c) printing one or more metal layers on or over a transistor array on a substrate, according to the one or more circuit layouts.

2. The method of claim 1, further comprising correcting the one or more circuit layouts and providing the one or more circuit layouts directly to a printing device, wherein said one or more metal layers are printed according to the corrected one or more circuit layouts.

3. The method of claim 2, wherein correcting the one or more circuit layouts comprises one or more processes including converting, resampling, and/or reprocessing the circuit layout to produce a working bitmap; determining and applying a set of correction rules; and/or manually manipulating the circuit layout.

4. The method of claim 1, wherein printing the one or more metal layers comprises inkjet printing, micro-spotting, pen-coating, syringe dispensing, pump dispensing, vapor-jet printing, gravure printing, offset lithography, flexographic printing, stamping, or screen printing an ink comprising a metal precursor in a solvent.

5. The method of claim 1, further comprising forming a dielectric layer on the transistor array prior to printing the one or more metal layers.

6. A method of field-configuring a circuit, comprising:
   a) depositing a first metal ink according to a predetermined wiring pattern on or over a substrate having (i) an array of transistors thereon and (ii) a first dielectric layer on the transistors, the first dielectric layer having a first plurality of contact openings therein, wherein the predetermined wiring pattern enables functionality and/or logic in a circuit comprising the transistors and the predetermined wiring pattern; and
   b) forming a first plurality of patterned metal lines from the first metal ink.

7. The method of claim 6, comprising depositing the first metal ink in some or all of the first plurality of contact openings.

8. The method of claim 6, wherein the array of transistors comprises a plurality of rows and a plurality of columns, wherein each intersection of one row and one column defines a location of one transistor in the array.

9. The method of claim 6, wherein the substrate comprises a single crystal silicon wafer, a metal sheet, a metal foil, a plastic sheet, a plastic film, a plastic web, a glass sheet or a glass slip.

10. The method of claim 6, further comprising printing the first dielectric layer on the substrate, wherein the first plurality of contact openings is formed in the first dielectric layer after printing the first dielectric layer, to expose the terminals of the transistors.

11. The method of claim 10, comprising selectively printing the first dielectric layer in a pattern covering portions of the transistors and exposing the terminals of the transistors.

12. The method of claim 10, wherein the first dielectric layer comprises an N- and/or P-dopant.

13. The method of claim 6, wherein depositing the first metal ink comprises inkjet printing, gravure printing, off-set lithography, screen printing, flexographic printing, microspotting, pen-coating, laser writing, syringe dispensing, stencil printing, and/or pump dispensing the metal ink.

14. The method of claim 6, wherein the first dielectric layer has a first layer of patterned metal wires thereon electrically connected to the transistors in the array, and the substrate further comprises a second dielectric layer on the first layer of patterned metal wires having a second plurality of contact openings therein.

15. The method of claim 6, wherein the transistors comprise thin film transistors.

16. The method of claim 6, wherein the first metal ink comprises a metal precursor material and a solvent, wherein the metal precursor material is present in an amount of 1 to 50 wt. % of the ink, and the metal precursor material is soluble in the solvent.

17. The method of claim 16, wherein the metal precursor material comprises metal nanoparticles and/or a metal compound of aluminum, titanium, vanadium, copper, silver, chromium, molybdenum, tungsten, cobalt, nickel, gold, palladium, platinum, zinc, and/or iron.

18. The method of claim 16, comprising drying the first metal ink to remove the solvent and form a dried metal-containing material, and annealing the dried metal-containing material to form the first plurality of patterned metal lines.

19. The method of claim 6, further comprising: a) forming a second dielectric layer on the first plurality of patterned metal lines, the second dielectric layer having a second plurality of contact openings therein exposing portions of the first plurality of patterned metal lines, b) printing a second metal ink on the second dielectric layer, and c) forming a second plurality of patterned metal lines from the printed second metal ink.

20. The method of claim 6, wherein forming the first plurality of patterned metal lines comprises printing a seed layer and then forming a bulk conductive layer on the seed layer.

* * * * *